United States Patent
Wu et al.

(10) Patent No.: US 9,520,861 B1
(45) Date of Patent: Dec. 13, 2016

(54) SYSTEM AND METHOD FOR HARMONIC SUPPRESSION

(71) Applicant: TEXAS INSTRUMENTS INCORPORATED, Dallas, TX (US)

(72) Inventors: Michael A. Wu, Audubon, PA (US); Sudipto Chakraborty, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/971,465

(22) Filed: Dec. 16, 2015

(51) Int. Cl.
  *H03K 3/03* (2006.01)
(52) U.S. Cl.
  CPC .................... *H03K 3/0315* (2013.01)
(58) Field of Classification Search
  CPC .................................... H03K 3/0315
  USPC ..................................... 331/57, 45
  See application file for complete search history.

(56) References Cited

U.S. PATENT DOCUMENTS 8,138,843 B2 * 3/2012 Straayer ............... G04F 10/005
                                                      324/76.54

* cited by examiner

*Primary Examiner* — Joseph Chang
(74) *Attorney, Agent, or Firm* — John R. Pessetto; Charles A. Brill; Frank D. Cimino

(57) ABSTRACT

A system to generate an oscillator signal. The system includes a multi-stage oscillator, where each stage generates an output. The system also includes a first weighting circuit coupled to the multi-stage oscillator. The first weighting circuit taps the outputs of at least some of the stages and applies a first variable weighting factor to each output of the tapped stages to generate a first weighted output for each of the tapped stages. The system also includes a first summing circuit coupled to the first weighting circuit. The first summing circuit sums the first weighted outputs of the tapped stages to produce the oscillator signal.

20 Claims, 3 Drawing Sheets

250
| HARMONIC | SQ WAVE | 3 STAGE | 5 STAGE | 7 STAGE | 9 STAGE | 11 STAGE |
|---|---|---|---|---|---|---|
| 3rd (dBc) | -9.5 | -43.5 | -43.5 | -50.7 | -50.7 | -57.8 |
| 5th (dBc) | -14.0 | -14.0 | -57.6 | -44.4 | -45.2 | -55.1 |
| 7th (dBc) | -16.9 | -16.9 | -43.4 | -56.6 | -59.0 | -45.5 |
| 9th (dBc) | -19.1 | -43.5 | -18.9 | -44.6 | -47.7 | -49.5 |
| 11th (dBc) | -20.8 | -20.8 | -21.0 | -51.3 | -59.4 | -58.6 |
FIG. 2B
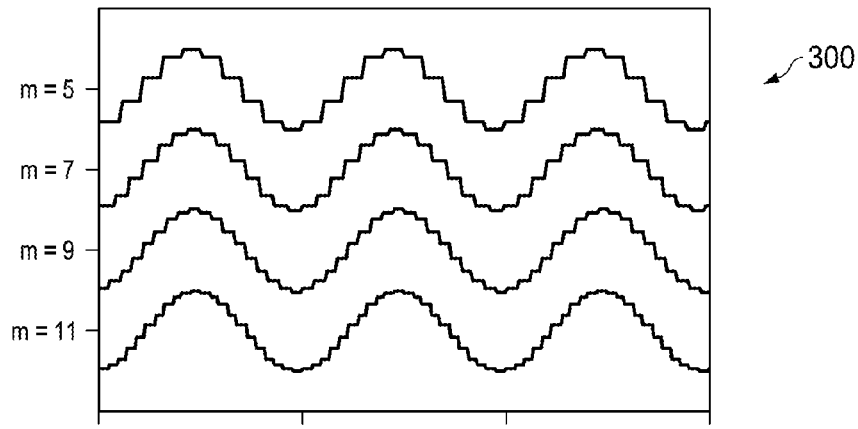
FIG. 3A
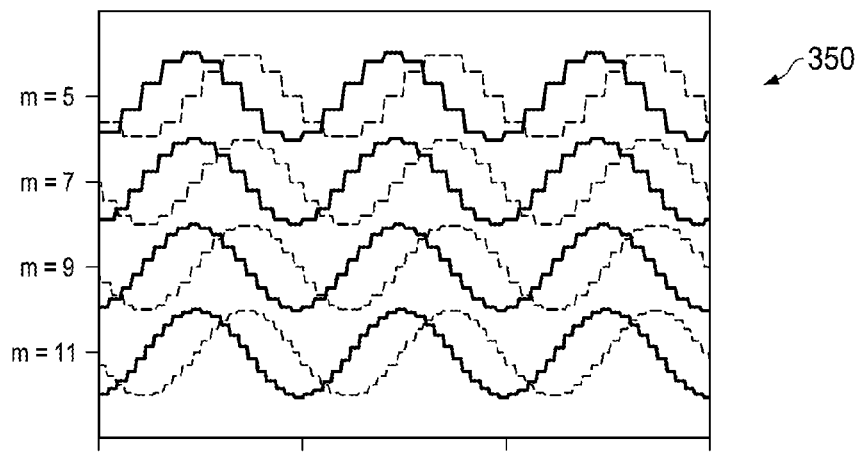
FIG. 3B

SYSTEM AND METHOD FOR HARMONIC SUPPRESSION

BACKGROUND

Transceiver systems, both wired and wireless, are used in a variety of consumer electronics, medical devices, automotive electronics, and other applications where reduced form factor and reduced cost are driving motivations. Of course, regardless of the application, a high signal-to-noise (SNR) ratio is desired, which requires a high fundamental signal to harmonic ratio.

In certain applications, a transceiver will not meet Federal Communications Commission (FCC) requirements (e.g., spectral mask requirements) if there is too much harmonic content in the output wave form. Conventionally, in order to achieve harmonic rejection levels of 40 dBc or better, significant filtering is applied using either on-chip or off-chip components, which require calibration and trimming, and consume area. Further, the use of multi-order filters may be required to achieve acceptably high harmonic filtering levels, which also consume both area and power, which is disadvantageous in any application where form factor and cost are considerations.

BRIEF DESCRIPTION OF THE DRAWINGS

For a detailed description of various examples, reference will now be made to the accompanying drawings in which:

FIG. 2b shows a table of harmonic reduction as a function of stage number of a multi-stage oscillator in accordance with various examples;

FIG. 3a shows various oscillator or carrier signal outputs of the system of FIG. 1 for various stage number implementations in accordance with various examples;

FIG. 3b shows various oscillator or carrier signal outputs of the system of FIG. 1 including quadrature components in accordance with various examples.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

Various examples of the present disclosure are directed to systems and methods of generating an oscillator or carrier signal with reduced harmonic content without relying on internal or external filtering, which is costly both in terms of area and power. In particular, a multi-stage oscillator such as a ring oscillator is employed, where the outputs of at least some of the stages are tapped. Other examples may employ alternate oscillator structures, such as an LC oscillator. The tapped stage outputs are phase-shifted relative to one another by virtue of the delay inherent to each stage of the multi-stage oscillator structure. A weighting circuit applies a variable weighting factor to each tapped stage output to generate a weighted output, and a summing circuit sums all of the weighted outputs to produce an oscillator or carrier signal. The selection of the weighting factor is dependent on the particular stage being tapped, and will be explained in further detail below.

The result is an oscillator or carrier signal with a near-sinusoidal waveform shape, which is then used by a subsequent driver stage to transmit over a cable or antenna, depending on the application. It should be appreciated that "near-sinusoidal" as used herein refers to a waveform that generally follows a sinusoidal form, but does not necessarily have a perfect sinusoidal shape, which is of course difficult to achieve in practice. A near-sinusoidal waveform has the benefit of reduced harmonic content relative to, for example, a square wave. As a result of the reduced harmonic content, such an oscillator or carrier signal output is more suitable for applications in which FCC requirements (e.g., spectral mask requirements) must be satisfied. Further, and as will be explained below, examples of the present disclosure avoid the need for on-chip or off-chip filtering, which is costly from a power and area perspective.

Figure 1:
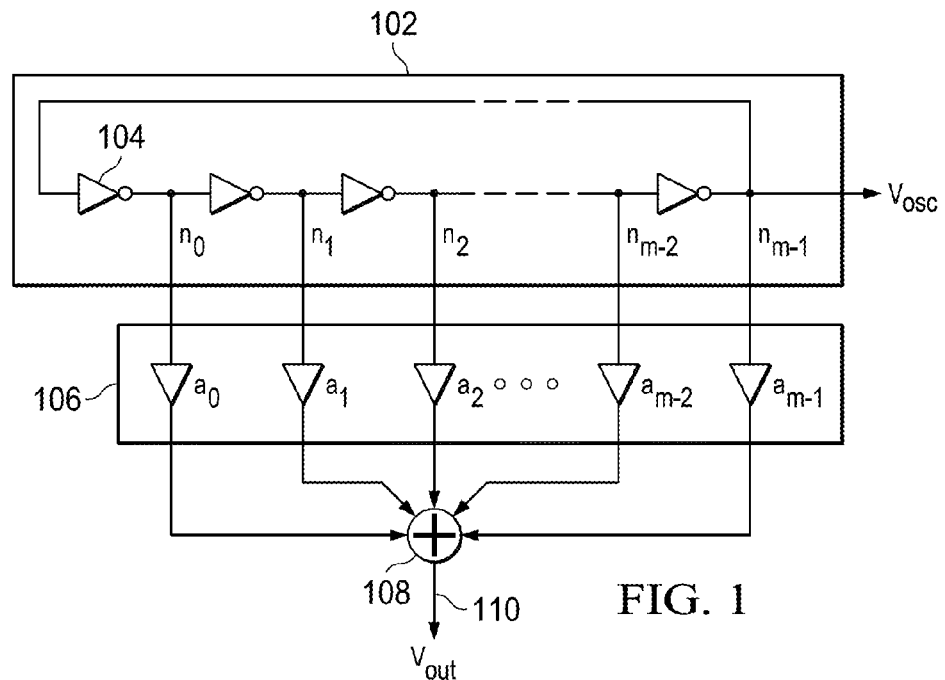
FIG. 1 shows a block diagram of a system for generating an oscillator or carrier signal with reduced harmonic components in accordance with various examples.

FIG. 1 shows a system 100 to generate an oscillator or carrier signal in accordance with various examples of the present disclosure. The system 100 includes a multi-stage oscillator 102, which in this particular case is a single-ended ring oscillator, but other such oscillator topologies (e.g., an LC oscillator or oscillators employing differential topologies) should be considered within the scope of the present disclosure as well. The multi-stage oscillator 102 may be, for example, a voltage-controlled oscillator (VCO).

The multi-stage oscillator 102 may include an odd number of stages 104 implemented as inverters (as shown), which serve as delay elements such that the output of each stage 104 is phase shifted from the output of the preceding stage 104. Since the multi-stage oscillator 102 includes an odd number of stages 104, the output of the oscillator 102 is inverted. However, in examples where the multi-stage oscillator 102 includes an even number of stages 104, the output of the oscillator 102 is not inverted. Each stage 104 generates a square shaped waveform that swings from rail to rail (e.g., from ground to a supply voltage). Although shown as a single-ended structure for simplicity, examples of the present disclosure may be extended to fully-differential structure as well. Further, certain examples of the present disclosure may similarly be directed to a multi-stage oscillator 102 having an even number of stages 104.

The output phasors of stages 104 will be $2\pi/m$ apart with respect to similar edges (i.e., rising or falling), where m is the number of stages 104 in the multi-stage oscillator 102. The phase-shifted output phasors are then utilized as switching waveforms to generate a set of scaled voltages or currents that, when summed, generate a near-sinusoidal waveform.

In particular, the system 100 includes a weighting circuit 106 that receives the phase-shifted output phasors and applies a variable weighting factor to each output. The weighting circuit 106 may apply the weighting factor in a number of ways, such as by scaling reference voltage, reference current, or component dimension (e.g., transistor or resistor size) for each particular stage 104 output. In accordance with certain examples of the present disclosure, the variable weighting factor ($a_n$) is determined by:

$$a_n = \cos(n\pi/m) - \cos((n+1)\pi/m) \quad \text{(Equation 1),}$$

where n is a tap number and m is the number of stages. The weighting factor for a particular phase-shifted output is applied, and the resulting weighted output is an output of the weighting circuit 106. That is, the weighting circuit 106 generates a number of outputs equal to the number of tapped stages 104 of the multi-stage oscillator 102.

Of course, it should be appreciated that Equation 1 need not necessarily be determinative of the weights applied to the stage 104 outputs, and the scope of the present disclosure is not so limited. In fact, other weighting schemes may be utilized, in particular those in which the resultant output is near-sinusoidal in nature, which has the benefit of reducing harmonic components from the signal while avoiding the need for on-chip or off-chip filtering, thus saving both power and area.

Figure 2A:
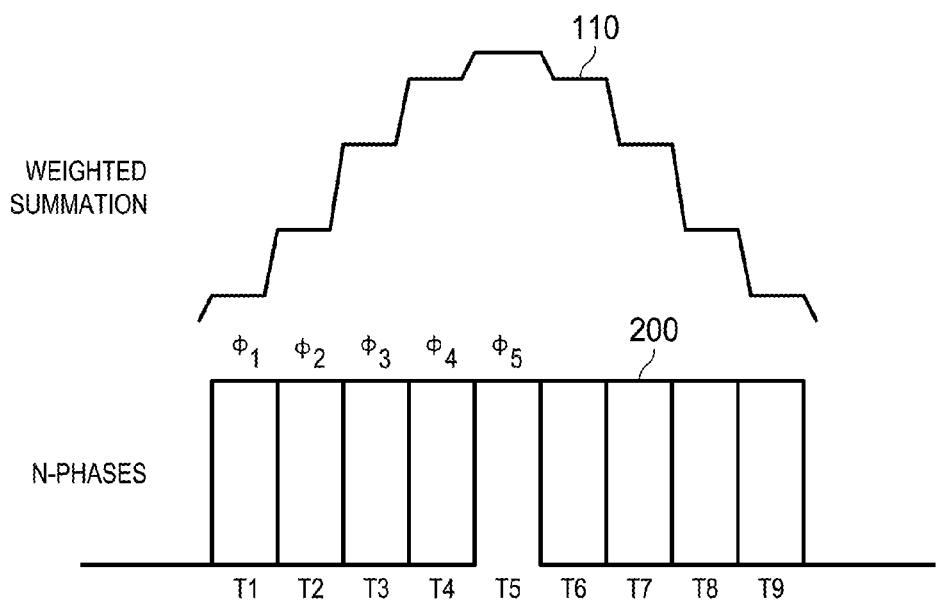
FIG. 2a shows an example of weighted, phase-shifted multi-stage oscillator outputs and their resulting summation in accordance with various examples.

The system 100 also includes a summing circuit 108 that combines the various weighted outputs generated by the weighting circuit 106, for example by summing their voltage or current. FIG. 2a demonstrates an example 200 in which five phase-shifted outputs are generated, notated by φ1-φ5. Using Equation 1 given above, the values for the tap weights are given by approximately 0.19, 0.5, 0.62, 0.5, and 0.19, respectively. Thus, the weighted summation in time period T1 is given by 0.19(φ1), the weighted summation in time period T2 is given by 0.19(φ1)+0.5(φ2), the weighted summation in time period T3 is given by 0.19(φ1)+0.5(φ2)+0.62(φ3), the weighted summation in time period T4 is given by 0.19(φ1)+0.5(φ2)+0.62(φ3)+0.5(φ4), and the weighted summation in time period T5 is given by 0.19(φ1)+0.5(φ2)+0.62(φ3)+0.5(φ4)+0.19(φ1). In subsequent time periods (i.e., T6-T9), contributions from the output phasors to the weighted sum are removed as those phasors oscillate to a low voltage (e.g., ground), starting with 0.19(φ1) and ending with 0.19(φ5). It should be appreciated that while the sequence of weights is important, the absolute phase is less so. That is, in this example, the weight sequence of {0.19, 0.5, 0.62, 0.5, 0.19} should be applied to output phasors in sequence, but the starting phase may be any one of the output phasors among the five.

As can be seen in view of FIGS. 1 and 2a, by intelligently applying weighting factors to phase-shifted stage 104 outputs of the multi-stage oscillator 102, the resultant waveform 110 takes on a near-sinusoidal shape, which greatly reduces the harmonic content as shown in the table 250 shown in FIG. 2b. Further, as shown in the table 250, an increase in the number of tapped stages generally results in further harmonic reduction, although with some associated increase in power consumption. Thus, depending on the particular application and harmonic reduction requirements, it may be advantageous to utilize only enough tapped stages to achieve the required harmonic reduction, so as to minimize power consumption and design area.

FIG. 3a shows an example 300 of oscillator or carrier signal outputs 110 of the system 100 for 5-, 7-, 9-, and 11-stage 104 implementations. As can be seen, the output 110 becomes cleaner as the number of stages 104 is increased, which corresponds to an increasing harmonic reduction as demonstrated in the table 250 shown in FIG. 2b. The resultant oscillator or carrier signal 110 with a near-sinusoidal waveform shape may then be used by a subsequent driver stage to transmit data over a cable or antenna, depending on the application.

To enhance the selectivity of wireless systems, a receiver typically uses downconversion using quadrature phases. Use of quadrature phases is also beneficial in wireless transmitters to create single sideband signals. Conventionally, the generation of a quadrature component is performed by running an oscillator at double the desired frequency and using a frequency divider. Further, as should be appreciated, using an odd number of oscillator stages 104 as in examples of the present disclosure does not inherently generate any quadrature phase component. Additionally, certain even numbers of stages also do not inherently generate a quadrature phase component. For example, in cases where the number of oscillator stages 104 is given by 2+4*x, where x is an integer, such as a 6-stage or a 10-stage oscillator, no inherent quadrature component is generated.

To address these issues, and in order to provide a quadrature component as needed in various applications, examples of the present disclosure include a second weighting circuit. The second weighting circuit is not shown for simplicity, but is similar to the weighting circuit 106, except that different weighting factors (which are similarly variable) are applied to the output phasors of the multi-stage oscillator 102. In particular, the variable weighting factor ($b_n$) for the second weighting circuit is determined by:

$$b_n = \sin(n\pi/m) - \sin((n+1)\pi/m) \quad \text{(Equation 2),}$$

where, as above, n is a tap number and m is the number of stages. The weighting factor for a particular phase-shifted output is applied, and the resulting weighted output is summed as explained above to generate a quadrature component of the oscillator or carrier signal output 110. In the examples where a quadrature component is generated, the two phases that are in quadrature are generated simultaneously, which is useful in wireless systems where both quadrature phases need to be available at the same time.

As above with Equation 1, it should be appreciated that Equation 2 need not necessarily be determinative of the weights applied to the stage 104 outputs to generate a quadrature component, and that the scope of the present disclosure is not so limited. In fact, other weighting schemes may be utilized, in particular those in which the resultant output is near-sinusoidal in nature and shifted by 90 degrees relative to the oscillator or carrier signal output 110, which has the benefit of reducing harmonic components from the both the output 110 as well as its quadrature component, while avoiding the need for on-chip or off-chip filtering, thus saving both power and area.

FIG. 3b shows an example 350 of oscillator or carrier signal outputs 110 of the system 100 for 5-, 7-, 9-, and 11-stage 104 implementations, including their quadrature components. As can be seen, the output 110 and quadrature components become cleaner as the number of stages 104 is increased, which corresponds to an increasing harmonic reduction as demonstrated in the table 250 shown in FIG. 2b. The resultant oscillator or carrier signal 110, along with its quadrature component, with a near-sinusoidal waveform shape may then be used by a subsequent driver stage to transmit or receive data over a cable or antenna, depending on the application.

Although the above implementation of a second weighting circuit to generate a quadrature component is functional, in some applications it may be desirable to reduce the number of coefficients or weighting factors applied to the different output phasors. For example, to avoid difficulty in realizing a large number of tap coefficients, an additional phase shift may be employed to shift the overall output phasor vectors. In the 5-stage ring oscillator example explained above, the resulting coefficients from Equations 1 and 2 are:

$a_n$: 0.19, 0.5, 0.62, 0.5, 0.19; and $b_n$: −0.59, −0.36, 0, 0.36, 0.59

As will be appreciated, reliance on differing sets of coefficient values results in approximately double the circuitry to apply ten coefficient values to the outputs from the five stages 104. Certain applications of examples of the present disclosure will benefit from quantizing the various weighting factors. For example, if the weighting or scaling factors are implemented using current sources, they should be quantized into sets of unit current sources in order to permit good matching. Since the weighting factors as above-defined will quantize slightly differently, there will be a mismatch between the oscillator carrier output signal 110 and its generated quadrature component. Thus, the weighting equations may be similarly phase-shifted to eliminate this difference, for example being given by:

$$a_n = \cos(n\pi/m + \pi/4) - \cos((n+1)\pi/m + \pi/4) \quad \text{(Equation 3)},$$

$$b_n = \sin(n\pi/m + \pi/4) - \sin((n+1)\pi/m + \pi/4) \quad \text{(Equation 4)},$$

In the 5-stage ring oscillator example explained above, the resulting coefficients from Equations 3 and 4 are approximately:

$a_n$: 0.55, 0.61, 0.44, 0.10, −0.28; and $b_n$: −0.28, 0.10, 0.44, 0.61, 0.55

It will be appreciated that both the generation of the near-sinusoidal oscillator or carrier output signal 110 and its quadrature component thus utilize the same set of tap weights, although in a different order and applied to different stages 104 of the multi-stage oscillator 102. However, by reducing the amount of weighting factors required to produce both a near-sinusoidal oscillator or carrier output signal 110 and its quadrature component, additional power and space savings may be realized through the ability to reuse some of the weighting circuit 106 for multiple purposes. As above, the two phases that are in quadrature are generated simultaneously, which is useful in wireless systems where both quadrature phases need to be available at the same time.

Of course, as with Equations 1 and 2, it should be appreciated that Equations 3 and 4 need not necessarily be determinative of the weights applied to the stage 104 outputs, and that the scope of the present disclosure is not so limited. In fact, other weighting schemes may be utilized to leverage the same weighting factors to generate both an oscillator or carrier output signal as well as its quadrature component.

Figure 4:
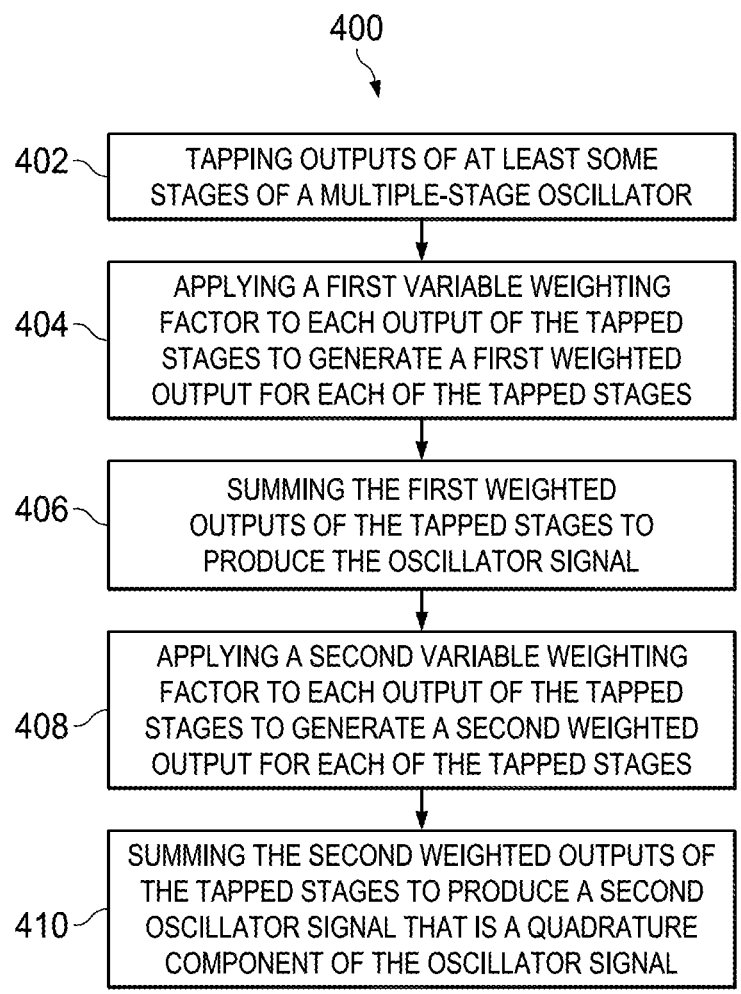
FIG. 4 shows a flow chart of a method in accordance with various examples.

FIG. 4 shows a flow chart of a method 400 in accordance with examples of the present disclosure. The method 400 begins in block 402 with tapping outputs of at least some stages of a multiple-stage oscillator. The multi-stage oscillator may be a ring oscillator, but other such oscillator topologies are possible as well. The multi-stage oscillator includes a number of stages, which may be inverters to serve as delay elements such that the output of each stage is phase shifted from the output of the preceding stage, as explained with respect to FIG. 1. Each stage generates a square shaped waveform that swings from rail to rail (e.g., from ground to a supply voltage).

The method 400 continues in block 404 with applying a variable weighting factor to each output of the tapped stages to generate a weighted output for each of the tapped stages. The output phasors of the tapped stages will be $2\pi/m$ apart with respect to similar edges (i.e., rising or falling), where m is the number of stages in the multi-stage oscillator. The weighting factor is applied to the outputs of the stages to generate a set of scaled voltages or currents that, when summed, generate a near-sinusoidal waveform.

The method 400 further continues in block 406 with summing the weighted outputs of the tapped stages to produce the oscillator signal. That is, the various weighted outputs are combined, for example by summing their voltage or current. As explained with respect to FIG. 2a, for example, a near-sinusoidal oscillator or carrier signal is generated when the weighted outputs are summed, with the weights being determined according to Equation 1 or another similar method.

Optionally, the method 400 generates a quadrature component by applying, in block 408, a second variable weighting factor to each output of the tapped stages and in block 410 with summing the second weighted outputs of the tapped stages to produce the quadrature component of the oscillator signal generated in block 406. By using different weights for the tapped stages, a quadrature component is generated that is near-sinusoidal in nature and shifted by 90 degrees relative to the oscillator or carrier signal output, which has the benefit of reducing harmonic components from the quadrature component as well, while avoiding the need for on-chip or off-chip filtering, thus saving both power and area.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system to generate an oscillator signal, comprising:
a multi-stage oscillator, wherein each stage generates an output;
a first weighting circuit coupled to the multi-stage oscillator and configured to:
tap the outputs of at least some of the stages; and
apply a first set of variable weighting factors to the outputs of the tapped stages to generate first weighted outputs for the tapped stages, the weighting factor applied to at least one of the outputs differing from the weighting factor applied to at least one other of the outputs; and
a first summing circuit coupled to the first weighting circuit and configured to sum the first weighted outputs of the tapped stages to produce the oscillator signal.

2. The system of claim 1 wherein the multi-stage oscillator comprises a voltage-controlled oscillator.

3. The system of claim 1 wherein the multi-stage oscillator comprises a ring oscillator.

4. The system of claim 1 wherein the first weighting circuit is configured to tap the output of all of the stages of the multi-stage oscillator.

5. The system of claim 1 wherein the first set of variable weighting factors is applied such that the resultant sum of the first weighted outputs is near-sinusoidal.

6. The system of claim 1 wherein each of the first variable weighting factors ($a_n$) is determined by:

$$a_n = \cos(n\pi/m) - \cos((n+1)\pi/m),$$

where n is a tap number and m is a number of stages of the multi-stage oscillator.

7. The system of claim 1 wherein a number of stages of the multi-stage oscillator is odd.

8. The system of claim 1 further comprising:
a second weighting circuit coupled to the multi-stage oscillator and configured to:
tap the outputs of the at least some of the stages; and
apply a second set of variable weighting factors to the outputs of the tapped stages to generate second weighted outputs for the tapped stages; and
a second summing circuit coupled to the second weighting circuit and configured to sum the second weighted outputs of the tapped stages to produce a second oscillator signal;
wherein the second oscillator signal comprises a quadrature component of the oscillator signal.

9. The system of claim 8 wherein the second variable weighting factor is applied such that the resultant sum of the second weighted outputs is near-sinusoidal and shifted 90 degrees from the oscillator signal.

10. The system of claim 8 wherein:
the variable weighting factors of the first weighting circuit ($a_n$) are determined by:

$$a_n = \cos(n\pi/m) - \cos((n+1)\pi/m), \text{ and}$$

the variable weighting factors of the second weighting circuit ($b_n$) are determined by:

$$b_n = \sin(n\pi/m) - \sin((n+1)\pi/m),$$

where n is a tap number and m is a number of stages of the multi-stage oscillator.

11. The system of claim 8 wherein the first and second sets of variable weighting factors are determined such that a set of resulting coefficients comprising the first set of weighting factors is equal to a set of resulting coefficients comprising the second set of weighting factors.

12. A method for generating an oscillator signal, comprising:
tapping outputs of at least some stages of a multi-stage oscillator;
applying a first set of variable weighting factor to the tapped stages to generate first weighted outputs for the tapped stages; and
summing the first weighted outputs of the tapped stages to produce the oscillator signal.

13. The method of claim 12 further comprising tapping the output of all of the stages of the multi-stage oscillator.

14. The method of claim 12 wherein the first set of variable weighting factor is applied such that the resultant sum of the first weighted outputs is near-sinusoidal.

15. The method of claim 12 wherein the first set of variable weighting factors ($a_n$) is determined by:

$$a_n = \cos(n\pi/m) - \cos((n+1)\pi/m),$$

where n is a tap number and m is a number of stages of the multi-stage oscillator.

16. The method of claim 12 further comprising:
applying a second set of variable weighting factors to the output of the tapped stages to generate second weighted outputs for the tapped stages; and
summing the second weighted outputs of the tapped stages to produce a second oscillator signal;
wherein the second oscillator signal comprises a quadrature component of the oscillator signal.

17. The method of claim 16 wherein the second set of variable weighting factors is applied such that the resultant sum of the second weighted outputs is near-sinusoidal and shifted 90 degrees from the oscillator signal.

18. The method of claim 16 wherein:
the first set of variable weighting factors ($a_n$) is determined by:

$$a_n = \cos(n\pi/m) - \cos((n+1)\pi/m), \text{ and}$$

the second set of variable weighting factors ($b_n$) is determined by:

$$b_n = \sin(n\pi/m) - \sin((n+1)\pi/m),$$

where n is a tap number and m is a number of stages of the multi-stage oscillator.

19. The method of claim 16 wherein the first and second sets of variable weighting factors are determined such that a set of resulting coefficients comprising the first set of weighting factors is equal to a set of resulting coefficients comprising the second set of weighting factors.

20. The method of claim 12 wherein the multi-stage oscillator comprises a ring oscillator.

* * * * *